United States Patent
Ishii

(10) Patent No.: US 6,920,163 B2
(45) Date of Patent: Jul. 19, 2005

(54) SEMICONDUCTOR LASER DRIVING CIRCUIT AND SEMICONDUCTOR LASER DRIVING METHOD THEREFOR

(75) Inventor: Mitsuo Ishii, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 496 days.

(21) Appl. No.: 10/233,407

(22) Filed: Sep. 4, 2002

(65) Prior Publication Data

US 2003/0052370 A1 Mar. 20, 2003

(30) Foreign Application Priority Data

Sep. 4, 2001 (JP) ........................................ 2001-267057

(51) Int. Cl.$^7$ ................................................ H01S 3/00
(52) U.S. Cl. ................................ 372/38.02; 372/38.03; 372/38.04; 372/38.07
(58) Field of Search ............................... 372/23, 38.02, 372/38.03, 38.04, 38.07, 68

(56) References Cited

U.S. PATENT DOCUMENTS 4,232,678 A * 11/1980 Skovajsa .................... 607/89

OTHER PUBLICATIONS

Elantec Inc., "EL6290C—Product Brief—Laser Diode Driver with Waveform Generator", May 12, 2000.

ATMEL, "5–channel Laser Driver with RF Oscillator and 2 Outputs, T0800", 4503A–DVD–01/02.

* cited by examiner

*Primary Examiner*—Minsun Oh Harvey
*Assistant Examiner*—Armando Rodriguez
(74) *Attorney, Agent, or Firm*—Birch, Stewart, Kolasch & Birch, LLP

(57) ABSTRACT

A semiconductor laser driving circuit drives a plurality of semiconductor laser devices having different objective operating voltages, and has a power source for generating power voltages for the semiconductor laser devices, a power voltage changeover means for changeover from one of the power voltages to another, a current amplification section for supplying a driving current to the semiconductor laser device with the power voltage so that the semiconductor laser device comes to have its respective objective operating voltage.

6 Claims, 2 Drawing Sheets

SEMICONDUCTOR LASER DRIVING CIRCUIT AND SEMICONDUCTOR LASER DRIVING METHOD THEREFOR

BACKGROUND OF THE INVENTION

The present invention relates to a semiconductor laser driving circuit and a semiconductor laser driving method. In particular, the present invention relates to a semiconductor laser driving circuit for driving a plurality of semiconductor laser devices of different objective operating voltages, as in the case of a short-wavelength violet laser and a long-wavelength red laser for performing recording and reproduction on, for example, an optical disc. The present invention relates also to a semiconductor laser driving method for operating such a semiconductor laser driving circuit.

In order to perform recording and reproduction on an optical disc, a semiconductor laser device that has an oscillation wavelength in a 780-nm band is employed in an optical disc apparatus of CD (Compact Disc), MD (Mini Disc) and the like, while a semiconductor laser device that has an oscillation wavelength in a 650-nm band is employed in an optical disc apparatus of DVD (digital versatile disc) and the like.

Conventionally, among optical disc apparatuses to perform recording and reproduction of audio and video data or to be mounted in personal computers, there have been known one in which two kinds of semiconductor laser devices corresponding to two wavelengths are mounted in one housing so as to achieve compatible use for the recording and reproduction of a DVD system and the recording and reproduction of a CD system. The optical disc apparatuses of the above-mentioned kind include an apparatus in which two kinds of semiconductor laser devices are driven by one semiconductor laser driving circuit for the purpose of reductions in apparatus cost and consumption power.

For example, a CD-DVD combination laser driver (article number: EL6290C), which is produced by Elantec Inc., drives two kinds of mounted semiconductor laser devices by means of a driving circuit that uses an identical 5-V power voltage.

Moreover, a 5-channel laser driver (article number: T0800), which can cope with DVD-RAM and CD-RW and is produced by TEMIC Corp. drives two kinds of semiconductor laser devices mounted by means of a current amplification circuit that performs rapid switching with an identical 5-V power voltage.

The oscillation wavelength of the semiconductor laser device is varied depending on the constituent material of the device. Therefore, the semiconductor laser devices constituted of different material have different oscillation wavelengths each other, and the semiconductor laser devices of different oscillation wavelengths have respective inherent objective operating voltages. For example, the objective operating voltage of the semiconductor laser device of the 650-nm band is higher than the objective operating voltage of the semiconductor laser device of the 780-nm band by about 0.5 V (note that each voltage is not higher than about 2 V).

It is herein noted that the power voltage is set giving priority to the semiconductor laser device of the 650-nm band of the high objective operating voltage in the conventional driving circuit that employs an identical power voltage. Therefore, when driving the semiconductor laser device of the 780-nm band of the low objective operating voltage, the power voltage that exceeds the optimum level is used for the driving. This has consequently led to the problem that wasteful power has been consumed by the semiconductor laser driving circuit.

Moreover, in the conventional driving circuit, the power sources of the current amplification circuit corresponding to both the semiconductor laser devices are consistently turned on even when only one semiconductor laser device is driven so that an unnecessary pulse such as short-period surge is not generated at the time of changeover of the semiconductor laser devices. Then, the changeover between light emission and light non-emission is performed by the selection of the semiconductor laser device. Therefore, the current amplification circuit corresponding to the semiconductor laser device of light non-emission has also been operated. This has led a problem that unnecessary electric power has been consumed.

There has been a problem that the temperature inside the optical disc apparatus mounted with the semiconductor laser driving circuit has risen because the greater part of the above-mentioned unnecessary electric power consumed by the semiconductor laser driving circuit has been transformed into heat.

There has also been a problem that the operating time of a battery has been reduced in the case of the battery used as a power source since the semiconductor laser driving circuit consumes the electric power very much.

Moreover, a semiconductor laser device, which has a wavelength in a 400-nm band, has recently been developed. When operating the semiconductor laser device of the 400-nm band, a voltage of about 3 V is needed as a voltage across both ends of the device in order to satisfy the diode characteristics, and a voltage value exceeding 4 V is needed as a voltage across both ends of the device also in the vicinity of the threshold of light emission. As a result, a voltage value (about +9 V) exceeding 5 V is needed as a power voltage for driving the semiconductor laser device of the 400-nm band. If the semiconductor laser device of this 400-nm band is driven with same power voltage (about +9 V) in addition to the aforementioned long-wavelength semiconductor laser device, then the aforementioned problems become more serious, as exemplified by a further increase in wasteful power consumption.

SUMMARY OF THE INVENTION

An object of the present invention is to provide a semiconductor laser driving circuit which drives a plurality of semiconductor laser devices of different objective operating voltages by changeover and which is able to reduce power consumption.

Another object of the present invention is to provide a semiconductor laser driving method for properly operating the semiconductor laser driving circuit.

In order to achieve the aforementioned objects, the present invention provides a semiconductor laser driving circuit for driving, by changeover, a plurality of semiconductor laser devices that have mutually different objective operating voltages, comprising:

a power source for generating a plurality of power voltages at different levels for the respective semiconductor laser devices;

a power voltage changeover means for selecting, by changeover, a power voltage from among the power voltages according to objective operating voltages of the semiconductor laser devices; and a current amplification section for supplying a driving current to one of the semiconductor laser devices by means of the power voltage selected by changeover so that the one of the semiconductor laser devices comes to have its objective operating voltage.

It is to be noted that the "objective operating voltage" means a voltage for properly operating a semiconductor laser device.

According to the semiconductor laser driving circuit of the present invention, the power source generates power voltages at different levels for the semiconductor laser devices, and the power voltage changeover means selects by changeover a power voltage from among the power voltages according to the objective operating voltages of the semiconductor laser devices. The current amplification section supplies a driving current to the one of the semiconductor laser devices with the selected power voltage so that the one of the semiconductor laser devices comes to have its respective objective operating voltage. Therefore, the semiconductor laser devices are driven with the power voltages at the optimum levels corresponding to the respective objective operating voltages. That is, the semiconductor laser device of a low objective operating voltage is driven with a low-level power voltage, and the semiconductor laser device of a high objective operating voltage is driven with a high-level power voltage. This consequently eliminates the possible occurrence of driving the semiconductor laser device of the low objective operating voltage with the high-level power voltage when driving the semiconductor laser device of the low objective operating voltage. Therefore, the power consumption can be reduced further than in the conventional case. Moreover, there can be avoided the problems of temperature rise due to wasteful power consumption and a reduction of a battery in operating time when using the battery as a power source.

Moreover, since the possible occurrence of driving the semiconductor laser device of the low objective operating voltage with the high-level power voltage is eliminated, it is restricted to grow the amplitude of an unnecessary pulse of short-period surge or the like. Therefore, unexpected accidents such as the damages of the semiconductor laser device are reduced.

In one embodiment of the present invention, the semiconductor laser driving circuit further comprises a semiconductor laser device changeover means for selecting, by changeover, a semiconductor laser device receiving the driving current from the current amplification section from among the plurality of semiconductor laser devices.

According to this embodiment, the semiconductor laser device for receiving the driving current from the current amplification section is selected out of the plurality of semiconductor laser devices by the semiconductor laser device changeover means. No driving current is supplied to the non-selected semiconductor laser device. As a result, it is allowed to provide circuit components for only one semiconductor laser device by sharing the circuit components of the current amplification section between the semiconductor laser devices. Therefore, the circuit construction can be simplified.

In one embodiment of the present invention, the current amplification section includes circuit components independently provided for each of the semiconductor laser devices.

According to this embodiment, if a power voltage is selected by the power voltage changeover means, then the current amplification section can supply a driving current from one of the circuit components to one of the semiconductor laser devices so that the one of the semiconductor laser devices come to have its objective operating voltage. As a result, it is not required to provide the semiconductor laser device changeover means of, for example, a semiconductor laser device changeover switch. Moreover, each of the circuit components of the current amplification section can optimally be designed for the corresponding semiconductor laser device, and there is an increased degree of flexibility of design.

In one embodiment of the present invention, the plurality of semiconductor laser devices include a semiconductor laser device that has an oscillation wavelength in a 400-nm band.

In general, the semiconductor laser device, which has an oscillation wavelength in the 400-nm band, has an objective operating voltage in the range of 4 V to 6 V. Accordingly, a power voltage of about +9 V is needed. The semiconductor laser driving circuit of this one embodiment drives the semiconductor laser device, which has a high objective operating voltage and an oscillation wavelength in the 400-nm band. However, with the power voltage (about +9 V) for the above-mentioned purpose, this circuit does not drive the semiconductor laser device having a low objective operating voltage, for example, about 2 V and oscillation wavelengths in the 780-nm or 650-nm band. Therefore, the power consumption is reduced. In particular, it is effective for power consumption reduction to lower the power voltage during the recording operation of the semiconductor laser device of the long-wavelength band because the driving current flowing through the semiconductor laser device becomes large.

Moreover, since this circuit does not drive the semiconductor laser device having a low objective operating voltage with the power voltage (about +9 V), it is restricted to grow the amplitude of an unnecessary pulse of short-period surge or the like. Therefore, unexpected accidents such as the damages of the semiconductor laser device are reduced.

The present invention provide a semiconductor laser driving method for operating the semiconductor laser driving circuit, comprising:

bringing the power voltage for the semiconductor laser device relevant to the changeover into an off-state during a changeover of the semiconductor laser device for receiving the driving current from the current amplification section.

According to the semiconductor laser driving method of the present invention, during changeover of the semiconductor laser device for receiving the driving current from the current amplification section, the power voltage for the semiconductor laser device relevant to the change is brought into the off-state. Therefore, during the changeover, the driving current from the current amplification section is not supplied to the semiconductor laser device relevant to the change. Therefore, the semiconductor laser device relevant to the changeover can be prevented from being damaged by an unnecessary current such as surge accompanying the changeover or from having a reduced operating life. This effect is particularly effective in changeover from the semiconductor laser device of the 400-nm band to the semiconductor laser device of the 780-nm band or the 650-nm band.

Moreover, the present invention also provides a semiconductor laser driving method for operating the semiconductor laser driving circuit, comprising:

performing a changeover of the semiconductor laser device before a changeover of the power voltage at time of changing over from a semiconductor laser device of a low objective operating voltage to a semiconductor laser device of a high objective operating voltage among the plurality of semiconductor laser devices, whereas performing the changeover of the power voltage before the changeover of the semiconductor laser device at time of changing over from a semiconductor laser device of a high objective operating voltage to a semiconductor laser device of a low objective operating voltage.

According to the present invention, changeover between the semiconductor laser devices can be performed on the low-level power voltage for the semiconductor laser device of the low objective operating voltage. That is, this arrangement eliminates the possible occurrence of driving the semiconductor laser device of the low objective operating voltage with the high-level power voltage for the semiconductor laser device of the high objective operating voltage. Therefore, the semiconductor laser device relevant to the change can be prevented from being damaged by an unnecessary current such as surge accompanying the change or from having a reduced operating life.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
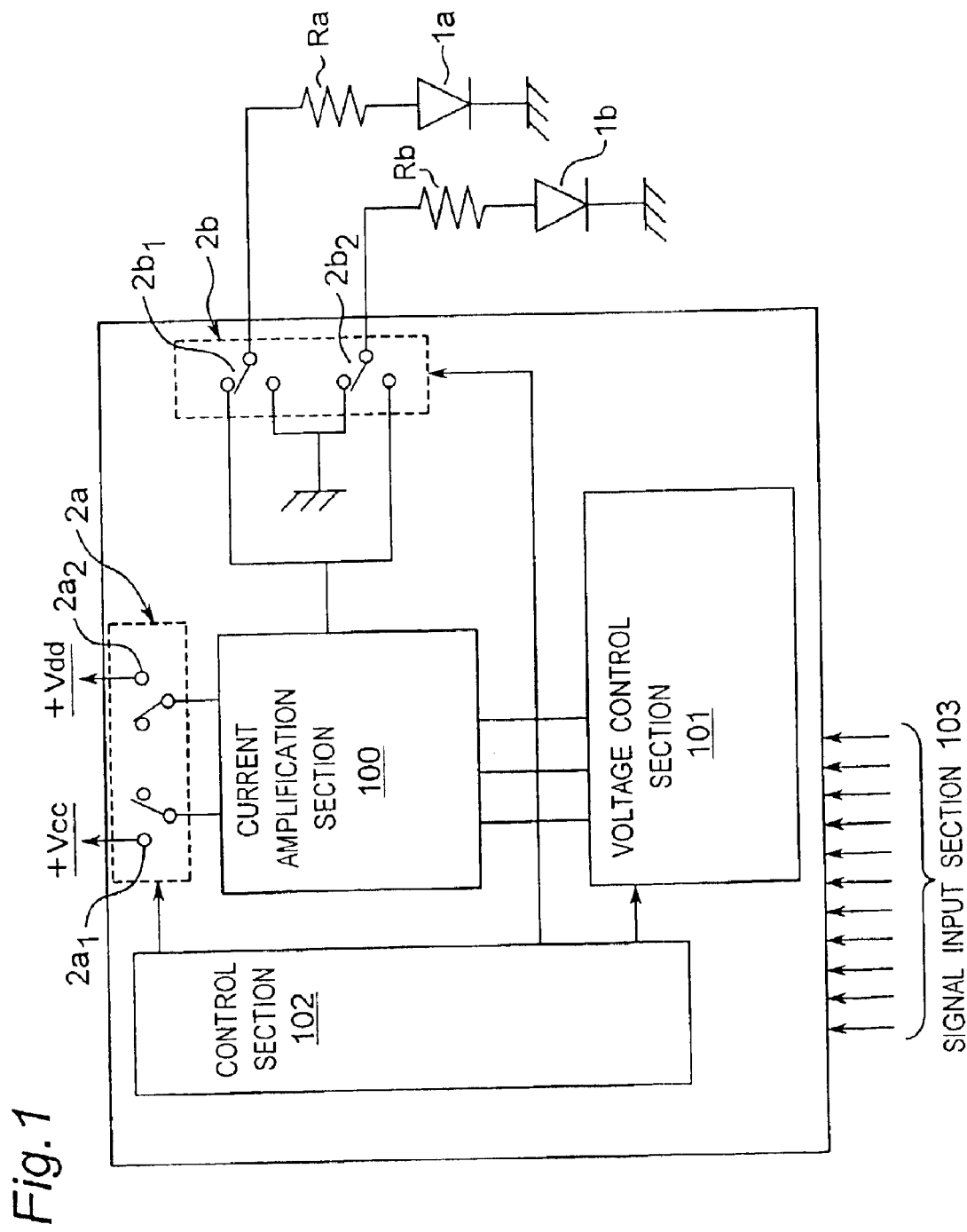
FIG. 1 is a diagram showing a construction of a semiconductor laser driving circuit according to a first embodiment of the present invention.

The present invention will be described in detail below on the basis of embodiments shown in the drawings.

First Embodiment

FIG. 1 shows a construction of a semiconductor laser driving circuit according to a first embodiment of the present invention.

This semiconductor laser driving circuit is provided with two semiconductor laser devices $1a$, $1b$, power sources, a current amplification section 100, a voltage control section 101, a control section 102, a signal input section 103, a power voltage changeover switch $2a$ as a power voltage changeover means, and a semiconductor laser changeover switch $2b$ as a semiconductor laser device changeover means.

The two semiconductor laser devices $1a$, $1b$ have mutually different objective operating voltages. The power sources generate power voltages +Vcc, +Vdd at different levels for these semiconductor laser devices $1a$, $1b$ (the voltages being denoted by the same symbols as those of the generated voltages for the sake of simplicity, provided that +Vcc<+Vdd). The power voltage changeover switch $2a$ is inserted between the power voltages +Vcc, +Vdd and the current amplification section 100. The semiconductor laser changeover switch $2b$ is inserted between the current amplification section 100 and the semiconductor laser devices $1a$, $1b$.

The semiconductor laser device $1a$ is formed on a GaAs substrate and has an oscillation wavelength in the 650 nm band and an objective operating voltage of 1.5 V to 1.7 V. The low-level power voltage for driving this semiconductor laser device $1a$ is 4V, that is, +Vcc=+4 V. On the other hand, the semiconductor laser device $1b$ is formed on a GaN substrate and has an oscillation wavelength in the 400-nm band and an objective operating voltage of 4.7 V to 6 V. The high-level power voltage for driving this semiconductor laser device $1b$ is +9 V, that is, +Vdd=+9 V.

These semiconductor laser devices $1a$, $1b$ are mounted in one casing of an optical disc apparatus and are intended to be driven in a changeover manner.

The cathodes of the semiconductor laser devices $1a$, $1b$ are grounded. Current limiting resistors Ra, Rb are inserted between the semiconductor laser changeover switch $2b$ and the anodes of the semiconductor laser devices $1a$, $1b$, respectively.

The control unit 102 controls driving voltage waveforms for the semiconductor laser devices, turning-on and turning-off of the changeover switches $2a$, $2b$, and other overall operations of this semiconductor laser driving circuit on the basis of a signal inputted to the signal input section 103.

The power voltage changeover switch $2a$ is constructed of a switch $2a_1$ and a switch $2a_2$. The switch $2a_1$ is for turning on and off the supply of the low-level power voltage +Vcc to the current amplification section 100. The switch $2a_2$ is for turning on and off the supply of the high-level power voltage +Vdd to the current amplification section 100.

The current amplification section 100 supplies a driving current to each of the semiconductor laser devices $1a$, $1b$ with the power voltage supplied via the power voltage changeover switch $2a$ so that the semiconductor laser devices $1a$, $1b$ come to have the respective objective operating voltages in operation. In this example, the circuit components of the current amplification section 100 are shared by the semiconductor laser devices $1a$, $1b$ and can be operated on either power voltage changed. That is, the circuit is simply constructed of the circuit components for one semiconductor laser device.

The voltage control section 101 adjusts the driving current of the current amplification section 100 on the basis of a control signal from the control section 102 so that the semiconductor laser devices $1a$, $1b$ come to have the respective objective operating voltages in operation.

The signal input section 103 is supplied with a changeover signal for selection between the semiconductor laser devices $1a$, $1b$ to receive the driving current from the current amplification section 100 and a signal for driving the semiconductor laser devices $1a$, $1b$ from the outside of this semiconductor laser driving circuit. Signals for driving the semiconductor laser devices $1a$, $1b$ include a reproduction driving signal for executing APC (Auto Power Control) control during reproduction in the optical disc recording and reproducing apparatus, a high-frequency superimposed signal and so on. During recording, there are further included a digital signal for determining the recording pulse width and a DC voltage signal for determining the recording power.

The semiconductor laser changeover switch $2b$ is constructed of a switch $2b_1$ for changing over whether or not the semiconductor laser device $1a$ is selected, and a switch $2b_2$ for changing over whether or not the semiconductor laser device $1b$ is selected. When the semiconductor laser device $1a$ is selected by the switch $2b_1$, a driving current from the current amplification section 100 is supplied to the semiconductor laser device $1a$ via the current limiting resistor Ra. When the semiconductor laser device $1a$ is made non-selected by the switch $2b_1$, the driving current from the current amplification section 100 is not supplied to the semiconductor laser device $1a$, and the anode of the semiconductor laser device $1a$ is grounded. Likewise, when the semiconductor laser device $1b$ is selected by the switch $2b_2$, the driving current from the current amplification section $100$ is supplied to the semiconductor laser device $1b$ via the current limiting resistor Rb. When the semiconductor laser device $1b$ is made non-selected by the switch $2b_2$, the driving current from the current amplification section $100$ is not supplied to the semiconductor laser device $1b$, and the anode of the semiconductor laser device $1b$ is grounded.

According to this semiconductor laser driving circuit, when the semiconductor laser device $1a$ is driven, the semiconductor laser device $1a$ is selected by the switch $2b_1$, and the semiconductor laser device $1b$ is made non-selected by the switch $2b_2$. Concurrently with this, the switch $2a_1$ is turned on to supply the low-level power voltage +Vcc to the current amplification section $100$. The switch $2a_2$ is turned off to turn off the supply of the high-level power voltage +Vdd to the current amplification section $100$. As a result, the semiconductor laser device $1a$ of the low objective operating voltage is driven with the low-level power voltage +Vcc. When the semiconductor laser device $1b$ is driven, the semiconductor laser device $1b$ is selected by the switch $2b_2$, and the semiconductor laser device $1a$ is made non-selected by the switch $2b_1$. Concurrently with this, the switch $2a_2$ is turned on to supply the high-level power voltage +Vdd to the current amplification section $100$. The switch $2a_1$ is turned off to turn off the supply of the low-level power voltage +Vcc to the current amplification section $100$. As a result, the semiconductor laser device $1b$ of the high objective operating voltage is driven with the high-level power voltage +Vdd.

As described above, according to this semiconductor laser driving circuit, the semiconductor laser devices $1a$, $1b$ are driven with the power voltages +Vcc and +Vdd at the optimum levels corresponding to the respective objective operating voltages. That is, this arrangement eliminates the possible occurrence of driving the semiconductor laser device $1a$ of the low objective operating voltage with the high-level power voltage +Vdd for the semiconductor laser device $1b$ of the high objective operating voltage. Therefore, the power consumption can be reduced further than in the conventional case. Moreover, there can be avoided the problem of temperature rise due to unwanted power consumption and the problem of a reduction in operating time when a battery is used as a power source.

Moreover, in this semiconductor laser driving circuit, it is desirable to adopt a first driving method or a second driving method, described as follows, in order to prevent the semiconductor laser devices from being damaged by an unnecessary current such as surge, which accompanies the changeover of the objective semiconductor laser device to be driven. These driving methods define the changeover manner of the switches $2a$, $2b$.

(1) First Driving Method

According to the first driving method, when the object to be driven is changed over from the semiconductor laser device $1a$ of the low objective operating voltage to the semiconductor laser device $1b$ of the high objective operating voltage, the semiconductor laser device is changed by the semiconductor laser changeover switch $2b$ before the power voltage is changed by the power voltage changeover switch $2a$. When changing over from the semiconductor laser device $1b$ of the high objective operating voltage to the semiconductor laser device $1a$ of the low objective operating voltage, the power voltage is changed by the power voltage changeover switch $2a$ before the semiconductor laser device is changed by the semiconductor laser changeover switch $2b$.

It is assumed now that, for example, the semiconductor laser device $1a$ of the low objective operating voltage is being driven. At this time, the +Vcc switch $2a_1$ of the power voltage switch $2a$ is in the on-state, the +Vdd switch $2a_2$ is in the off-state, the switch $2b_1$ of the semiconductor laser changeover switch $2b$ is in the selected state, and the switch $2b_2$ is in the non-selected state. It is herein assumed that the object to be driven is changed over from the semiconductor laser device $1a$ of the low objective operating voltage to the semiconductor laser device $1b$ of the high objective operating voltage. At this time, the switch $2b_1$ of the semiconductor laser changeover switch $2b$ is first changed to the non-selected state and the switch $2b_2$ is changed to the selected state while maintaining the +Vcc switch $2a_1$ of the power voltage switch $2a$ in the on-state and maintaining the +Vdd switch $2a_2$ in the off-state. Subsequently, the +Vcc switch $2a_1$ of the power voltage switch $2a$ is changed to the off-state, and the +Vdd switch $2a_2$ is changed to the on-state.

Conversely, when the object to be driven is changed from the semiconductor laser device $1b$ of the high objective operating voltage to the semiconductor laser device $1a$ of the low objective operating voltage, the +Vcc switch $2a_1$ of the power voltage switch $2a$ is first changed to the on-state, and the +Vdd switch $2a_2$ is changed to the off-state. Subsequently, the switch $2b$ of the semiconductor laser changeover switch $2b$ is changed to the selected state, and the switch $2b_2$ is changed to the non-selected state.

According to this first driving method, the semiconductor laser devices can be changed on the low-level power voltage +Vcc for the semiconductor laser device $1a$ of the low objective operating voltage. That is, this arrangement eliminates the possible occurrence of changing to the semiconductor laser device $1a$ of the low objective operating voltage on the high-level power voltage +Vdd for the semiconductor laser device $1b$ of the high objective operating voltage. Therefore, the semiconductor laser device $1a$ relevant to the change can be prevented from being damaged by an unnecessary current such as surge, which accompanies the changeover, and from having a reduced operating life. That is, a stress ascribed to the changeover of the power source is removed.

(2) Second Driving Method

According to the second driving method, when the semiconductor laser devices $1a$, $1b$, which are the objects to be driven, are changed by the semiconductor laser changeover switch $2b$, the power voltages for the semiconductor laser devices $1a$, $1b$ relevant to the changeover is brought into the off-state.

It is assumed now that, for example, the semiconductor laser device $1a$ of the low objective operating voltage is being driven. At this time, the +Vcc switch $2a_1$ of the power voltage switch $2a$ is in the on-state, the +Vdd switch $2a_2$ is in the off-state, the switch $2b_1$ of the semiconductor laser changeover switch $2b$ is in the selected state, and the switch $2b_2$ is in the non-selected state. It is herein assumed that the object to be driven is changed over from the semiconductor laser device $1a$ of the low objective operating voltage to the semiconductor laser device $1b$ of the high objective operating voltage. At this time, the +Vcc switch $2a_1$ of the power voltage switch $2a$ is first changed to the off-state (the +Vdd switch $2a_2$ is still in the off-state). Subsequently, the switch $2b_1$ of the semiconductor laser changeover switch $2b$ is changed to the non-selected state, and the switch $2b_2$ is changed to the selected state. Further, the +Vdd switch $2a_2$ of the power voltage switch $2a$ is subsequently changed to the on-state (the +Vcc switch $2a_1$ is still in the off-state).

Conversely, when the object to be driven is changed from the semiconductor laser device 1b of the high objective operating voltage to the semiconductor laser device 1a of the low objective operating voltage, the +Vdd switch $2a_2$ of the power voltage switch 2a is first changed to the off-state (the +Vcc switch $2a_1$ is still in the off-state). Subsequently, the switch $2b_1$ of the semiconductor laser changeover switch 2b is changed to the selected state, and the switch $2b_2$ is changed to the non-selected state. Further, the +Vcc switch $2a_1$ of the power voltage switch 2a is subsequently changed to the on-state (the +Vdd switch $2a_2$ is still in the off-state).

According to this second driving method, while the semiconductor laser devices 1a, 1b, which are the objects to be driven, are changed by the semiconductor laser changeover switch 2b, no driving current is supplied from the current amplification section 100 to the semiconductor laser devices 1a, 1b relevant to the changeover. Therefore, the semiconductor laser devices 1a, 1b can completely be prevented from being damaged by an unnecessary current such as surge that accompanies the changeover and from having a reduced operating life. This second driving method is superior to the first driving method in the point that it is completely free from a stress due to the changeover of the power sources. This effect is effective particularly at the time of changeover from the semiconductor laser device 1b of the 400-nm band to the semiconductor laser device 1a of the 780-nm band.

Second Embodiment

Figure 2:
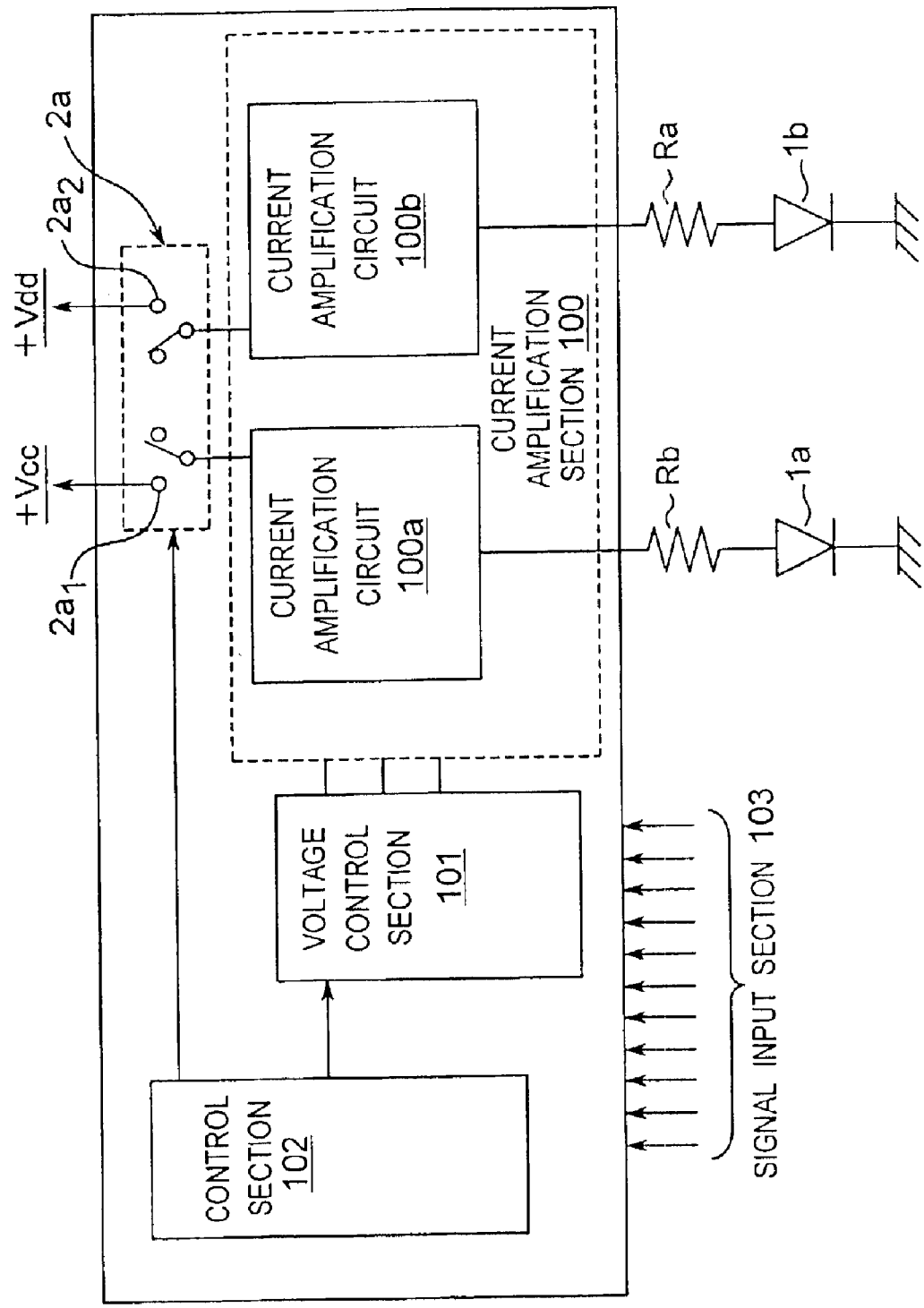
FIG. 2 is a diagram showing a construction of a semiconductor laser driving circuit according to a second embodiment of the present invention.

FIG. 2 shows the construction of the semiconductor laser driving circuit of the second embodiment. It is to be noted that the same components as those shown in FIG. 1 are denoted by the same symbols, and no description is provided therefor.

This semiconductor laser driving circuit differs from the semiconductor laser driving circuit shown in FIG. 1 in that current amplification circuits 100a, 100b are provided as circuit components corresponding to the semiconductor laser devices 1a, 1b, respectively, inside the current amplification section 100, and that the semiconductor laser changeover switch 2b is removed.

The current amplification circuit 100a of the current amplification section 100 receives the low-level power voltage +Vcc and supplies a driving current to the semiconductor laser device 1a of the low objective operating voltage with the power voltage +Vcc. On the other hand, the current amplification circuit 100b receives the high-level power voltage +Vdd and supplies a driving current to the semiconductor laser device 1b with the power voltage +Vdd. That is, these current amplification circuits 100a and 100b are provided independently for each of the semiconductor laser devices 1a, 1b and operate independently of each other.

With this arrangement, the changeover of the semiconductor laser devices 1a, 1b, which are the objects to be driven, is achieved only by turning on and off the power voltages +Vcc and +Vdd by means of the power voltage switch 2a. That is, if the voltage +Vcc is set in the on-state by the switch $2a_1$ and the voltage +Vdd is set in the off-state by the switch $2a_2$, then a driving current is supplied from the current amplification circuit 100a that receives the power voltage +Vcc in the on-state to the corresponding semiconductor laser device 1a. At this time, no driving current is supplied to the semiconductor laser device 1b. If the voltage +Vcc is set in the off-state by the switch $2a_1$ and the voltage +Vdd is set in the on-state by the switch $2a_2$, then a driving current is supplied from the current amplification circuit 100b that receives power the voltage +Vdd in the on-state to the corresponding semiconductor laser device 1b. At this time, no driving current is supplied to the semiconductor laser device 1a.

Therefore, according to this semiconductor laser driving circuit, the semiconductor laser devices 1a, 1b are driven with the power voltages +Vcc and +Vdd at the optimum levels corresponding to the respective objective operating voltages. That is, this arrangement eliminates the possible occurrence of driving the semiconductor laser device 1a of the low objective operating voltage with the high-level power voltage +Vdd for driving the semiconductor laser device 1b of the high objective operating voltage. Therefore, the power consumption can be reduced further than in the conventional case. Moreover, there can be avoided the problem of temperature rise due to unwanted power consumption and the problem of a reduction in operating time when a battery is used as a power source.

Although the circuit components of the current amplification section 100 are increased in comparison with the first embodiment, the circuit construction is simplified since the semiconductor laser changeover switch 2b is removed as described above. Moreover, since the current amplification circuits 100a, 100b of the current amplification section 100 can optimally be designed for the corresponding semiconductor laser devices, the degree of flexibility in designing is increased.

Moreover, in this semiconductor laser driving circuit, when changing over the semiconductor laser devices 1a, 1b which are the objects to be driven, an effect similar to that of the second driving method of the first embodiment can be obtained by once bringing both the switch $2a_1$, $2a_2$ inside the power voltage switch 2a into the off-state. That is, no driving current is supplied to the semiconductor laser devices 1a, 1b relevant to the changeover if both the switch $2a_1$ and the switch $2a_2$ are once brought into the off-state. Therefore, the semiconductor laser devices 1a, 1b can completely be prevented from being damaged by an unnecessary current such as surge that accompanies the changeover or from having a reduced operating life.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor laser driving circuit for driving, by changeover, a plurality of semiconductor laser devices that have mutually different objective operating voltages, comprising:

a power source for generating a plurality of power voltages at different levels for the respective semiconductor laser devices;

a power voltage changeover means for selecting, by changeover, a power voltage from among the power voltages according to objective operating voltages of the semiconductor laser devices; and a current amplification section for supplying a driving current to one of the semiconductor laser devices by means of the power voltage selected by changeover so that the one of the semiconductor laser devices comes to have its objective operating voltage.

2. The semiconductor laser driving circuit as claimed in claim 1, further comprising:

a semiconductor laser device changeover means for selecting, by changeover, a semiconductor laser device receiving the driving current from the current amplification section from among the plurality of semiconductor laser devices.

3. The semiconductor laser driving circuit as claimed in claim 1, wherein the current amplification section includes circuit components independently provided for each of the semiconductor laser devices.

4. The semiconductor laser driving circuit as claimed in claim 1, wherein the plurality of semiconductor laser devices include a semiconductor laser device that has an oscillation wavelength in a 400-nm band.

5. A semiconductor laser driving method for operating the semiconductor laser driving circuit claimed in claim 1, comprising:

bringing the power voltage for the semiconductor laser device relevant to the changeover into an off-state during a changeover of the semiconductor laser device for receiving the driving current from the current amplification section.

6. A semiconductor laser driving method for operating the semiconductor laser driving circuit claimed in claim 1, comprising:

performing a changeover of the semiconductor laser device before a changeover of the power voltage at time of changing over from a semiconductor laser device of a low objective operating voltage to a semiconductor laser device of a high objective operating voltage among the plurality of semiconductor laser devices, whereas performing the changeover of the power voltage before the changeover of the semiconductor laser device at time of changing over from a semiconductor laser device of a high objective operating voltage to a semiconductor laser device of a low objective operating voltage.

* * * * *